(12) United States Patent
Ha (10) Patent No.: US 7,995,399 B2
(45) Date of Patent: Aug. 9, 2011

(54) NAND MEMORY DEVICE AND PROGRAMMING METHODS

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 396 days.

(21) Appl. No.: 12/127,610

(22) Filed: May 27, 2008

(65) Prior Publication Data

US 2008/0266976 A1    Oct. 30, 2008

Related U.S. Application Data

(62) Division of application No. 11/216,739, filed on Aug. 31, 2005, now Pat. No. 7,388,789.

(51) Int. Cl.
   *G11C 11/34* (2006.01)

(52) U.S. Cl. .......... 365/185.25; 365/185.17; 365/185.23

(58) Field of Classification Search ............. 365/185.23, 365/185.17, 185.09, 185.25, 185.2, 185.18
See application file for complete search history.

(56) References Cited

U.S. PATENT DOCUMENTS

| | | | |
|---|---|---|---|
| 5,001,369 A | 3/1991 | Lee | |
| 5,097,149 A | 3/1992 | Lee | |
| 5,604,714 A | 2/1997 | Manning et al. | |
| 5,640,364 A | 6/1997 | Merrit et al. | |
| 5,680,595 A | 10/1997 | Thomann et al. | |
| 5,729,169 A | 3/1998 | Roohparvar | |
| 5,808,338 A * | 9/1998 | Gotou | 257/315 |
| 6,088,264 A * | 7/2000 | Hazen et al. | 365/185.11 |
| 6,282,132 B1 | 8/2001 | Brown et al. | |
| 6,584,035 B2 | 6/2003 | Di Iorio et al. | |
| 6,586,979 B2 | 7/2003 | Gromm et al. | |
| 6,958,940 B2 | 10/2005 | Takase et al. | |
| 6,975,538 B2 | 12/2005 | Abedifard et al. | |
| 6,977,842 B2 | 12/2005 | Nazarlan | |
| 7,359,243 B2 * | 4/2008 | Ha | 365/185.09 |
| 7,388,789 B2 | 6/2008 | Ha | |
| 2002/0101288 A1 | 8/2002 | Su et al. | |
| 2004/0240269 A1 * | 12/2004 | Cernea | 365/185.12 |
| 2005/0009362 A1 | 1/2005 | Nishida et al. | |
| 2005/0024134 A1 | 2/2005 | Bolz et al. | |
| 2005/0232012 A1 * | 10/2005 | Park | 365/185.17 |

* cited by examiner

*Primary Examiner* — VanThu Nguyen
*Assistant Examiner* — Hien N Nguyen
(74) *Attorney, Agent, or Firm* — Schwegman, Lundberg & Woessner, P.A.

(57) ABSTRACT

A NAND Flash memory device reduces circuitry noise during program operations. The memory includes bit lines that are electrically coupled together to charge share their respective voltage potentials prior to performing a discharge operation on the bit lines. A NAND flash cell is programmed by coupling a first memory array bit line to a program voltage to program the memory cell, biasing a second memory array bit line to a ground potential, wherein the second memory array bit line is located adjacent to the first memory array bit line, activating at least one first transistor to electrically coupling the first and second memory array bit lines together, and activating at least one second transistor to electrically couple the first and second memory array bit lines to a discharge potential.

11 Claims, 6 Drawing Sheets

NAND MEMORY DEVICE AND PROGRAMMING METHODS

RELATED APPLICATION(s)

This application is a divisional of U.S. application Ser. No. 11/216,739 filed Aug. 31, 2005 now U.S. Pat. No. 7,388,789, which is hereby incorporated by reference in its entirety.

FIELD OF THE INVENTION

The present invention relates to non-volatile memory devices and, more particularly, to NAND flash memory devices.

BACKGROUND

Flash memory is non-volatile, which means that it stores information on a semiconductor in a way that does not need power to maintain the information in the chip. Flash memory stores information in an array of transistors, called "cells," each of which traditionally stores one or more bits of information. The memory cells are based on the Floating-Gate Avalanche-Injection Metal Oxide Semiconductor (FAMOS transistor) which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cells source and drain connections, depending on the Vt of the cell. This presence or absence of current is sensed and translated into 1's and 0's, reproducing the stored data.

Memory cells of memory devices are typically arranged in an array with rows and columns. Generally, the rows are coupled via a word line conductor and the columns are coupled together with a bit line conductor. During data read and write functions, voltage coupling between bit lines can influence proper memory operation.

For reasons stated below which will become apparent to those skilled in the art upon reading and understanding the present specification, there is a need for methods and devices to program non-volatile memory devices.

SUMMARY

In one embodiment a non-volatile memory device includes an array of non-volatile memory cells having bit lines, and control circuitry to control voltage pre-charging and discharging of the bit lines during a program operation. The control circuitry further controls switching circuitry to charge share the bit lines prior to discharging.

In another embodiment, a method comprises biasing a first bit line of a NAND memory array to a first positive voltage during a program operation, and biasing a second bit line, located adjacent to the first bit line, to a second voltage having a potential less than the positive voltage. The first and second bit lines are coupled together to charge share the first positive voltage and second voltage to provide a resultant voltage on the first and second bit lines having a potential between the first positive voltage and the second voltage.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice as is well known in the art. The figures are provided to help facilitate an understanding of the detailed description, are not intended to be accurate in scale, and have been simplified. The term line or conductor as used herein is intended to include conductors and semi-conductors, including but not limited to metals, metal alloy, doped silicon and polysilicon.

The following detailed description is, therefore, not to be taken in a limiting sense, and the scope of the present invention is defined only by the appended claims, along with the full scope of equivalents to which such claims are entitled.

Figure 1:
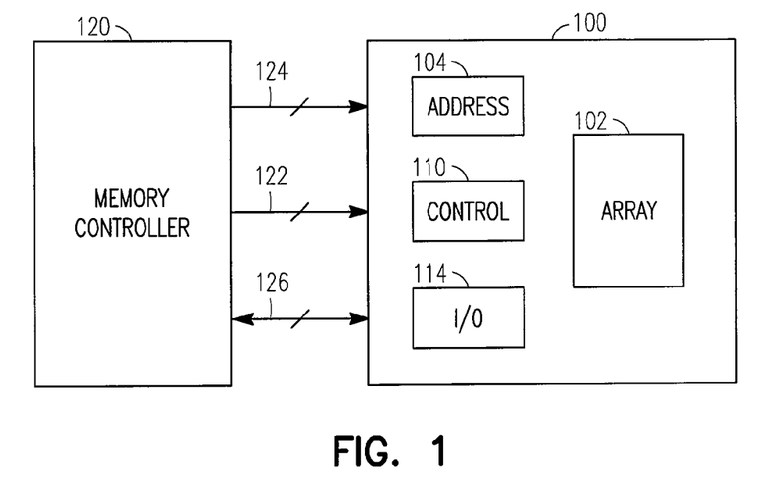
FIG. 1 is a block diagram of a memory device according to embodiments of the present invention.

FIG. 1 is a simplified block diagram of an integrated circuit memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as Flash memory cells because blocks of memory cells are typically erased concurrently, in a flash operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data can be written to or read from the memory cells across data, DQ, lines 126.

In addition to general memory functions, control circuit 110 performs a write operation on the memory cells. As explained below, the write operation includes controlling a write multiplex circuit.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Figure 2:
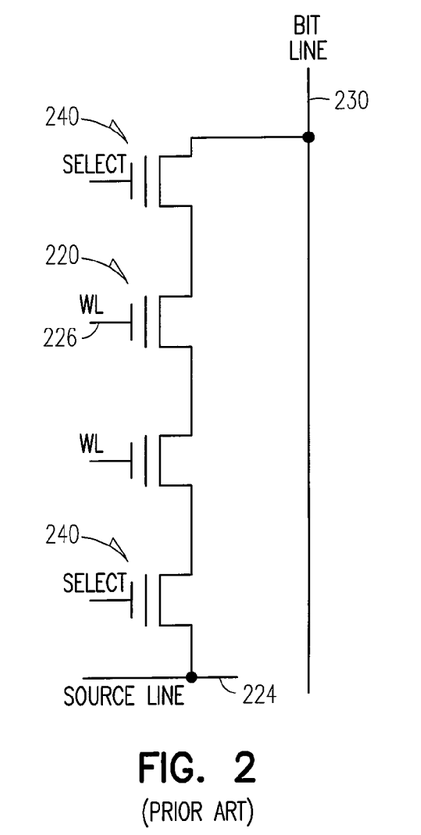
FIG. 2 illustrates a simplified portion of a prior art NAND flash memory array.

FIG. 2 illustrates a simplified portion of a prior art NAND flash memory array. NAND Flash uses tunnel injection for writing and tunnel release for erasing. The NAND memory includes floating gate memory cells 220 coupled to source line 224, word lines 226 and a bit line 230. The cells are coupled in a string, or series of cells between the bit line and source line. One or more bit line select transistors 240 are used to selectively isolate the cells from the bit and source lines.

In a read operation, a word line of a target (selected) memory cell can be maintained at a low voltage level. All unselected cell word lines are coupled to a voltage sufficiently high to activate the unselected cells regardless of their floating gate charge. If the selected cell has an uncharged floating gate, it is activated. The bit line and source line are then coupled through the series of memory cells. If the selected cell has a charged floating gate, it will not activate. The bit line and source lines, therefore, are not coupled through the series of memory cells.

Because of the close proximity of the memory cells, bit line coupling can be a problem during reading/sensing operations. That is, the length and close spacing of adjacent bit lines results in voltage noise on bit lines. Of particular concern is bit line coupling during write verify operations. As known to those skilled in the art, a write operation typically includes one or more program steps and one or more read/verify steps.

Figure 3:
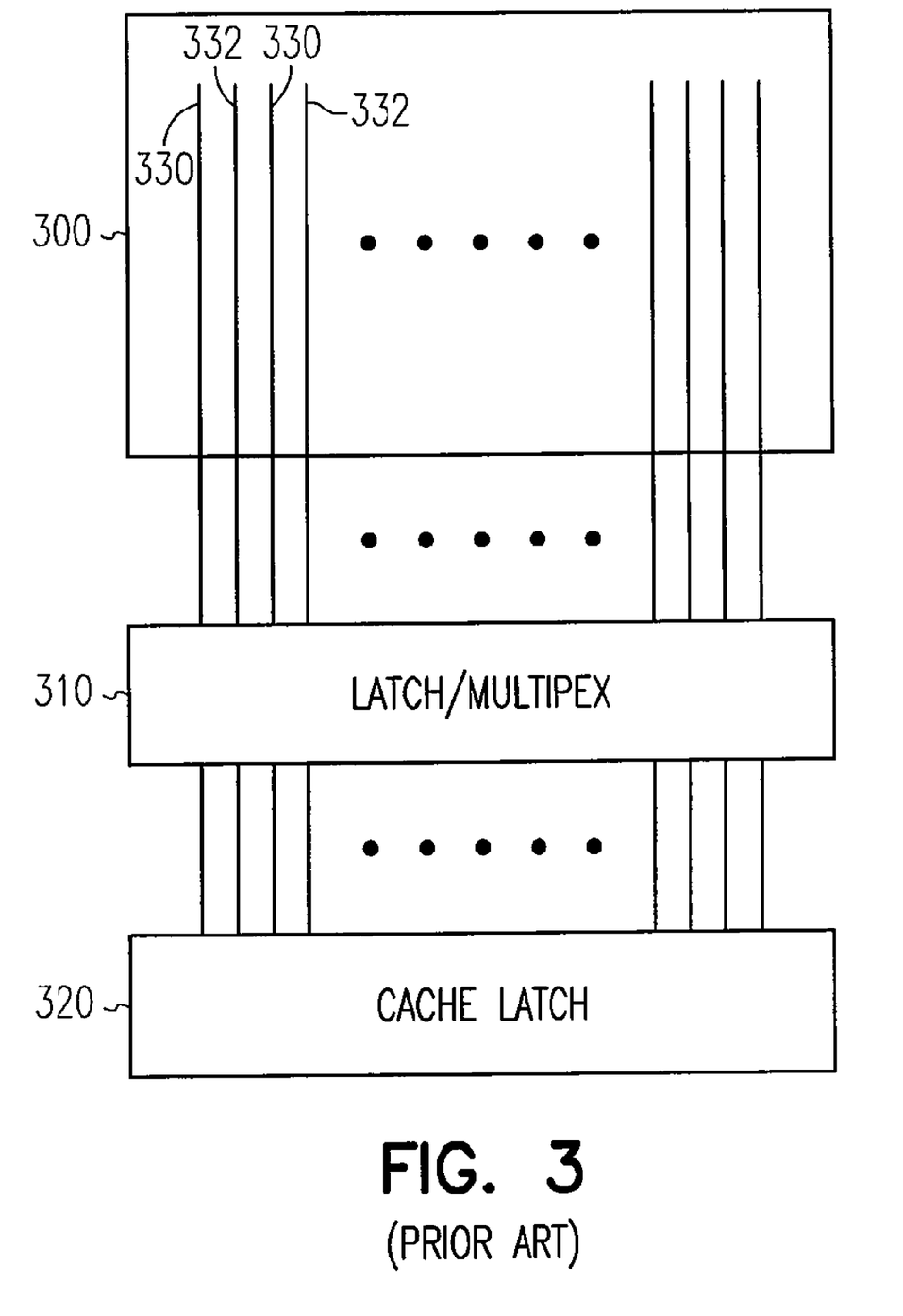
FIG. 3 is a block diagram of a prior art NAND flash memory circuitry.

During read/verify operations, the prior art couples the bit lines of the inactive page to a low potential, such as ground, to provide shielding against bit line coupling. As illustrated in FIG. 3, the prior art NAND memory word lines are divided into even and odd 'pages.' A latch and multiplex circuit 310 are used to couple data to an active one of the pages and bias bit lines of the non-active page. Optionally, a second latch 320 can be provided in the prior art devices to cache data for the second page, while writing to the first page.

The multiplex circuit 310 is a bi-directional switching circuit to couple bit lines to I/O circuit through a sense amplifier/latch circuit. Alternatively, the multiplex circuit couples bit lines to bias voltages during program and verify operations. Unselected bit lines are coupled to either a high bias potential, such as Vcc, during program operations of adjacent bit lines, or coupled to a low bias potential, such as ground, during verify operations of adjacent bit lines.

The pages are interwoven such that alternating bit lines 330 and 332 of array 300 belong to different pages. During operation, one page can be active and the other page can be inactive. The bit lines of the inactive page are coupled to a high potential, such as Vcc, during a program operation. The Vcc biased bit lines, therefore, prevent memory cells coupled to a common word line from being programmed.

Figure 4:
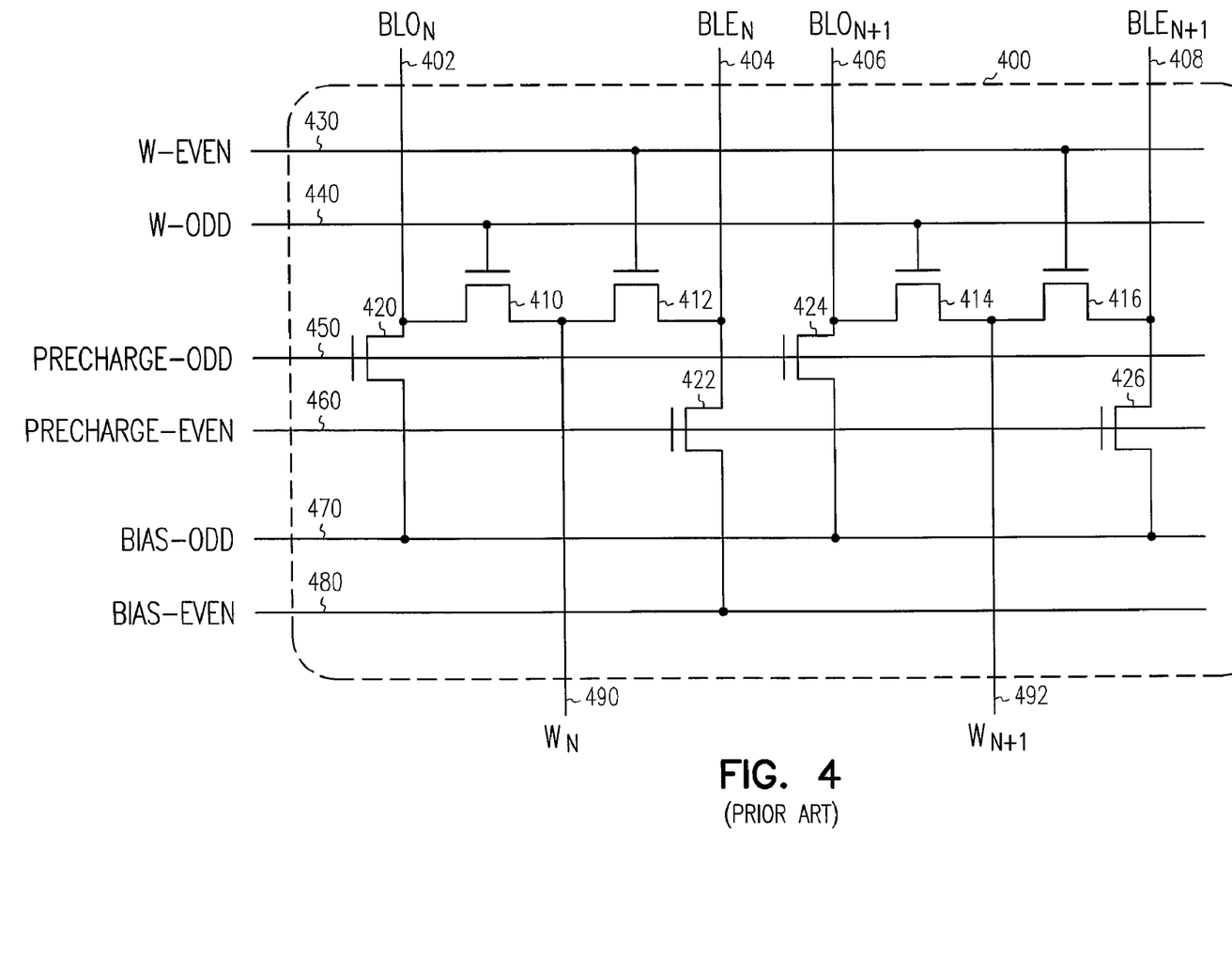
FIG. 4 is a simplified prior art multiplex circuit.

FIG. 4 is a simplified schematic diagram of a prior art write multiplex circuit 400. The circuit couples the bit lines 402, 404, 406 and 408 to write lines 490 and 492. The circuit is also used to couple bias voltages to bit lines. For example, odd bit lines 402 and 406 (BLOn and BLOn+1) form a logical odd page and even bit lines 404 and 408 (BLEn and BLEn+1) form a logical even page. When programming the odd bit lines, the even bit lines are coupled to Vcc. When programming the even bit lines, the odd bit lines are coupled to Vcc. Likewise, during verify (read) operations the non-active bit lines are coupled to a ground bias.

The input signals and voltages of the multiplex circuit include write signals (W-even and W-odd) on nodes 430 and 440 to selectively activate transistors 410, 412, 414 and 416 coupled between the bit lines and the write lines. Pre-charge signals (Precharge-even and Precharge-odd) on nodes 450 and 460 control transistors 420, 422, 424 and 426 coupled between the bit lines and bias signals (Bias-even and Bias-odd) on nodes 470 and 480.

Figure 5:
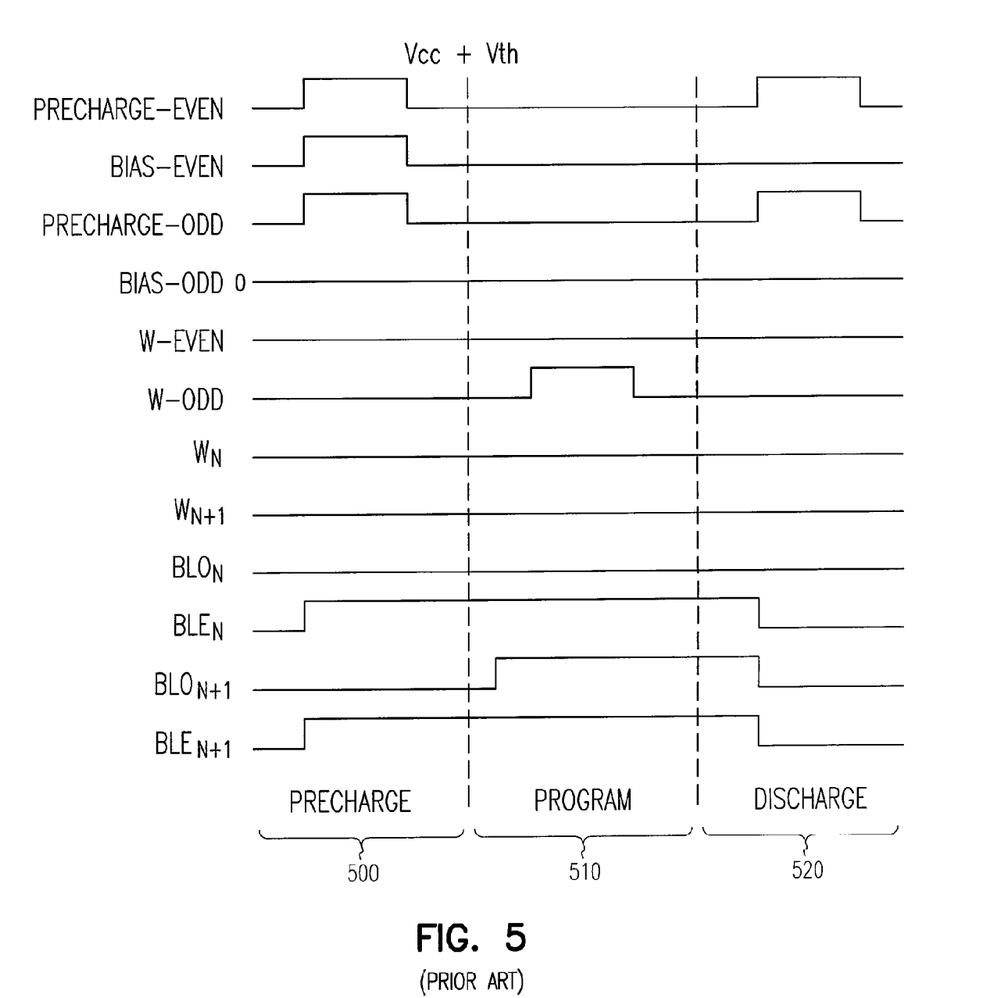
FIG. 5 is a prior art timing diagram

Referring to FIG. 5, a prior art sample timing diagram of an example operation of the circuit of FIG. 4 is described. In the illustrated example, data is written to the odd bit lines 404 and 408. The program operation can be divided into three basic phases, Pre-charge 500, Program 510 and Discharge 520.

In the Pre-charge phase 500 the even bit lines BLEn 404 and BLEn+1 408 are coupled to the Bias-even voltage of Vcc through transistors 422 and 426 by precharge-even (node 460) being at a high state (Vcc+Vth). This pre-charges BLEn 404 and BLEn+1 408 to Vcc.

In the Program phase 510 the data on Wn 490 and Wn+1 492 are coupled to the odd bit lines, BLOn 402 and BLOn+1 406, when transistors 410 and 414 are activated by W-odd (node 440) transitioning to a high state such as Vcc+Vth. In this example, the write data on Wn 490 is low and the write data on Wn+1 492 is high. As such, BLOn 402 remains low and BLOn+1 406 is coupled high.

In the Discharge phase 520, all of the bit lines are discharged through transistors 420, 422, 424 and 426. That is, the Bias-even (node 480) and Bias-odd (node 470) signals are grounded and transistors 420, 422, 424 and 426 are activated by high signals on precharge-even (node 460) and precharge-odd (node 450).

The coupling capacitance between bit lines has an adverse influence during the discharge phase. For example, a bit line at zero volts can be coupled negative by an adjacent bit line. Specifically, a bit line voltage of $0-Vcc*(2\ Cc/(Ci+2\ Cc))$ can be realized where Cc is a bit line coupling capacitance, and Ci is the bit line intrinsic capacitance. In a NAND memory, the actual bit line voltage may be clamped at or near −0.5 volts (diode junction drop) depending upon fabrication techniques. This negative bit line voltage can create noise and possible malfunction of circuitry located near the memory array.

Figure 6:
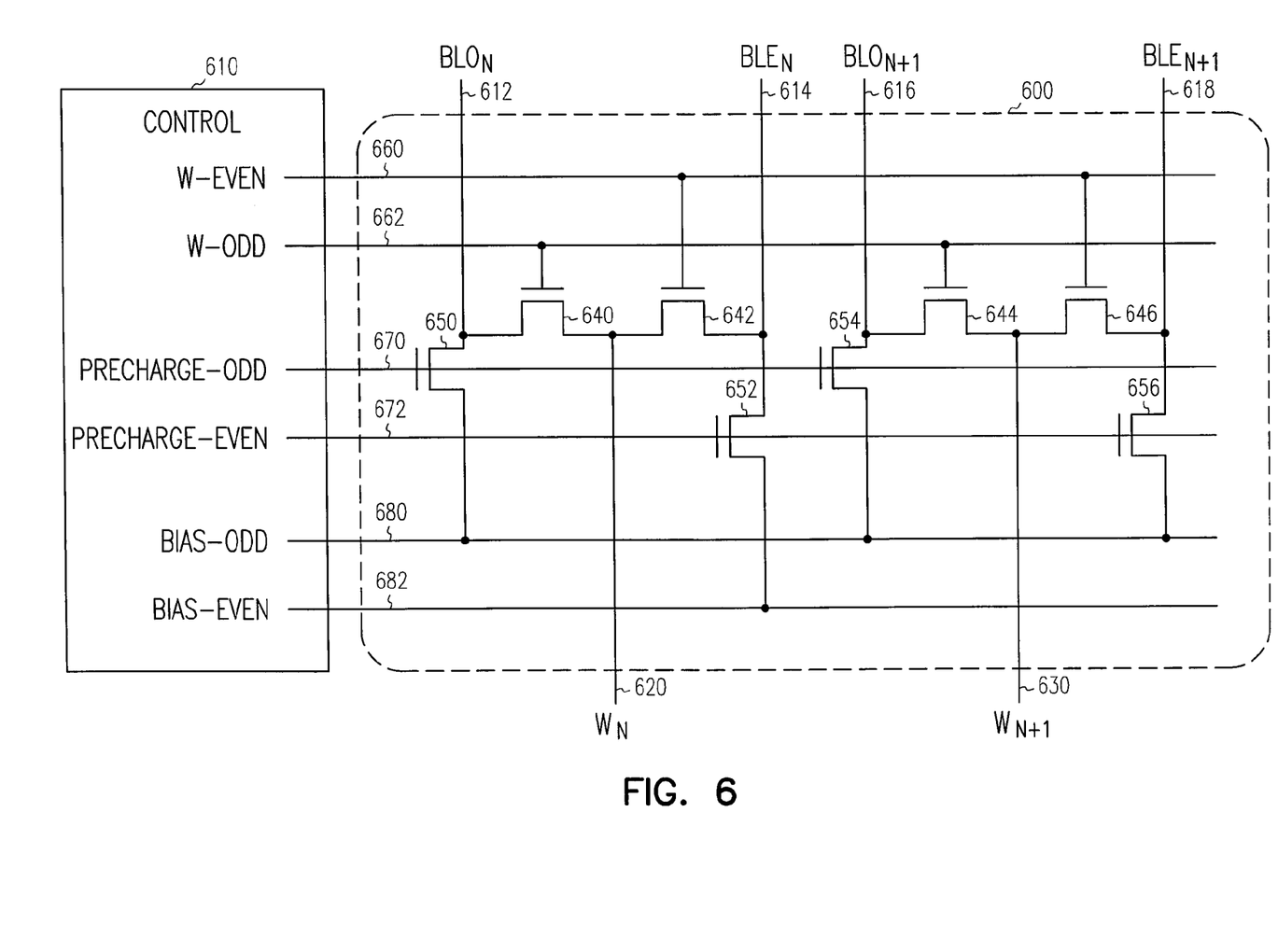
FIG. 6 is a simplified schematic of multiplex and control circuitry according to embodiments of the present invention.
Figure 7:
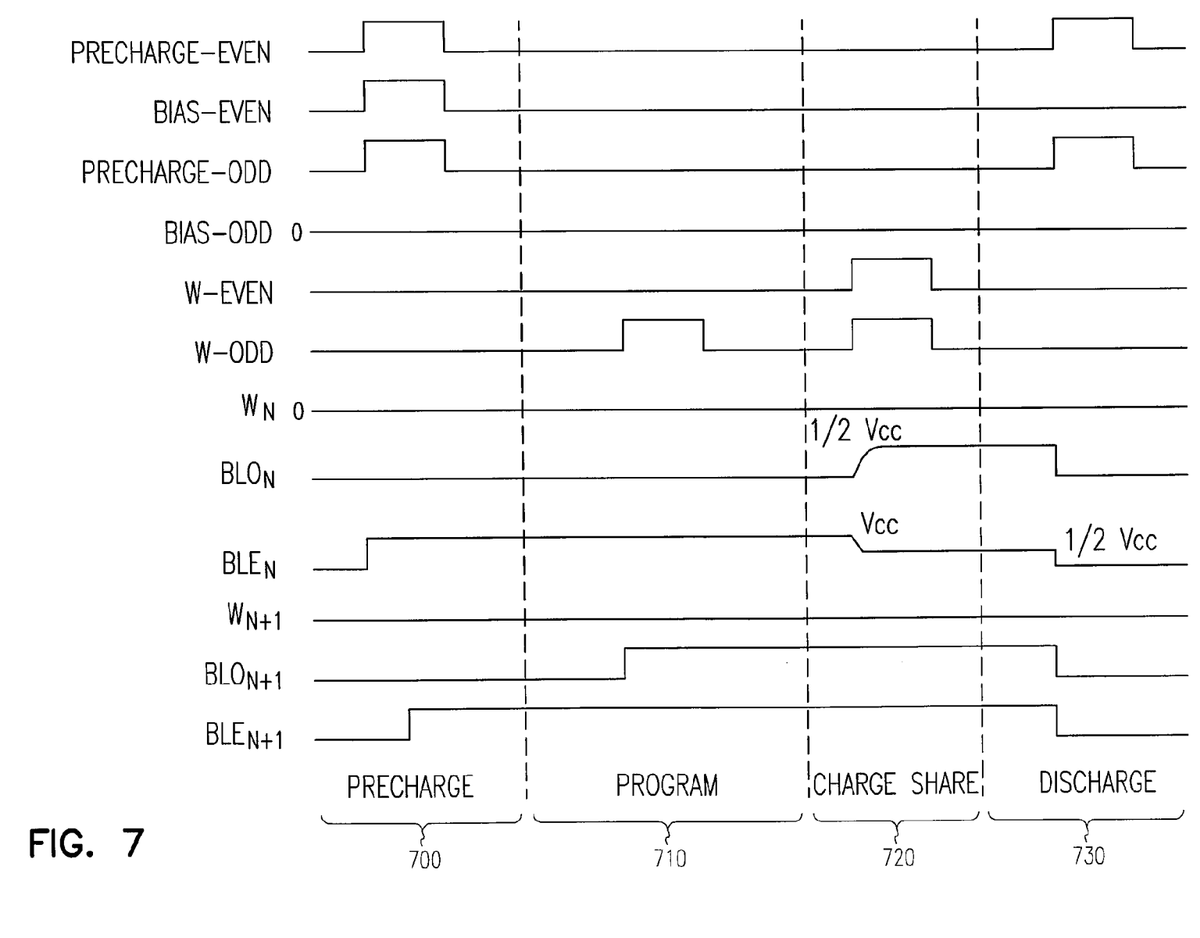
FIG. 7 is a timing diagram of the circuitry of FIG. 6 according to embodiments of the present invention.

Referring to FIGS. 6 and 7 a NAND memory and example timing diagram of embodiments of the present invention are described. A multiplex circuit 600 of one embodiment can include switching circuitry to selectively couple bit lines 612, 614, 616 and 618 to either write data lines 620 and 630 or bias voltages on nodes 680 and 682. Each bit line is coupled to two transistors 640/650, 642/652, 644/654 and 646/656. The first transistor 640, 642, 644 and 646 has a gate coupled to a gate signal, W-odd (node 662) or W-even (node 660), and selectively couples the bit line to the write line, Wn 620 or Wn+1 630. The second transistor 650, 652, 654 and 656 has a gate coupled to a gate signal, precharge-odd (node 670) or precharge-even (node 672), and selectively couples the bit line to a bias voltage on connection bias-odd (node 680) or bias-even (node 682). The illustrated multiplex circuit 600 has been simplified to illustrate four bit lines. It will be appreciated by those skilled in the art that each multiplex circuit can be coupled to thousands of bit lines.

Control circuitry 610 is provided to control the gate signals and bias voltages 660, 662, 670, 672, 680 and 682. Control circuitry 610 can be generally incorporated into the memory control circuitry 110 but is separately illustrated in FIG. 6 for purposes of explanation. The control circuitry activates the multiplex circuit 600 to charge share adjacent bit lines 612/614 and 616/618 prior to discharging the bit lines. In the illustrated embodiment of FIG. 6 the control circuitry activates transistors 640, 642, 644 and 646 to electrically couple the even and odd bit lines. As such, if a pre-charged bit line at Vcc potential is coupled to a bit line at ground potential, the bit lines move to ½ Vcc prior to discharge.

Referring to FIG. 7 a sample timing diagram of an example operation of the circuit of FIG. 6 is described. In the illustrated example, data is written to the odd bit lines. The program operation can be divided into four basic phases, Pre-charge 700, Program 710, Charge Share 720 and Discharge 730.

In the Pre-charge phase 700 the even bit lines 614 and 618 are coupled to the Bias-even voltage of Vcc, on node 682, through transistors 652 and 656 by precharge-even, node 672, being at a high state (Vcc+Vth). This pre-charges BLEn 614 and BLEn+1 618 to Vcc.

In the Program phase 710 the data on Wn 620 and Wn+1 630 is coupled to the odd bit lines, BLOn 612 and BLOn+1 616, when transistors 640 and 644 are activated by W-odd, node 662, transitioning to a high state such as Vcc+Vth. In this example, the write data on Wn is low and the write data on Wn+1 is high. As such, BLOn 612 remains low and BLOn+1 616 is coupled high.

In the Charge Share phase 720 W-even on node 660 and W-odd on node 662 both transition to Vcc to activate transistors 640, 642, 644 and 646. Because the transistors are couple to an even and an odd bit line, bit lines 612 and 614 share their charges and bit lines 616 and 618 share their charges. The resultant charge may be less than Vcc. As illustrated, the Wn 620 write voltage is zero (ground) while the Wn+1 630 write voltage is Vcc. Bit lines BLOn 612 and BLEn 614, therefore, equilibrate during charge sharing to about ½Vcc. In contrast, bit lines BLOn+1 616 and BLEn+1 618 are both at Vcc and remain at Vcc during charge sharing.

In the Discharge phase 730, all of the bit lines 612, 614, 616 and 618 are discharged through transistors 650, 652, 654 and 656. That is, the Bias-even (node 682) and Bias-odd (node 680) signals are grounded and transistors 650, 652, 654 and 656 are activated by high signals on precharge-even (node 672) and precharge-odd (node 670). By adding the Charge Share phase to the NAND memory program operations the noise experienced by circuitry near the memory array during the Discharge phase can be reduced.

The invention claimed is:

1. A method of programming comprising:
    biasing a first bit line of a NAND memory array to a first positive voltage during a program operation;
    biasing a second bit line, located adjacent to the first bit line, to a second voltage having a potential less than the positive voltage; and
    coupling the first and second bit lines together to charge share the first positive voltage and second voltage to provide a resultant voltage on the first and second bit lines having a potential between the first positive voltage and the second voltage.

2. The method of claim 1 wherein the first positive voltage is about a supply voltage potential, Vcc, and the second voltage is about zero volts.

3. The method of claim 1 further comprising coupling the first and second bit lines to ground potential following coupling the first and second bit lines together.

4. The method of claim 1 wherein biasing the first bit line comprises coupling the first bit line of the NAND memory array to a write line biased to the first positive voltage.

5. The method of claim 4 wherein the first bit line is coupled to the write line using a multiplex circuit.

6. The method of claim 1 wherein biasing the second bit line comprises coupling the second bit line to a bias node using a multiplex circuit.

7. A method of programming a memory cell in a NAND flash memory comprising:
    coupling a first memory array bit line to a program voltage to program the memory cell;
    biasing a second memory array bit line to a ground potential, wherein the second memory array bit line is located adjacent to the first memory array bit line;
    activating at least one first transistor to electrically coupling the first and second memory array bit lines together; and
    activating at least one second transistor to electrically couple the first and second memory array bit lines to a discharge potential.

8. The method of claim 7 wherein the at least one first transistor and the at least one second transistor are located in a write multiplex circuit.

9. The method of claim 7 wherein the program voltage is about a supply voltage, Vcc.

10. A method of programming a memory cell in a NAND flash memory comprising:
    activating a first transistor coupled between a first memory array bit line and a data write line, wherein the data write line is biased to a program voltage;
    activating a second transistor coupled between a second memory array bit line and a bias node biased to a ground potential, wherein the second memory array bit line is located adjacent to the first memory array bit line;
    activating the first and a third transistor to electrically coupling the first and second memory array bit lines together; and
    activating the second and a fourth transistor to electrically couple the first and second memory array bit lines to a discharge potential.

11. The method of claim 10 wherein the first, second, third and fourth transistors are located in a write multiplex circuit of the memory.

* * * * *

UNITED STATES PATENT AND TRADEMARK OFFICE
CERTIFICATE OF CORRECTION

PATENT NO. : 7,995,399 B2  
APPLICATION NO. : 12/127610  
DATED : August 9, 2011  
INVENTOR(S) : Chang Wan Ha Page 1 of 1

It is certified that error appears in the above-identified patent and that said Letters Patent is hereby corrected as shown below:

In the Specifications:

In column 1, line 7, delete "2005" and insert -- 2005, --, therefor.

Signed and Sealed this  
Fourteenth Day of May, 2013

Teresa Stanek Rea  
*Acting Director of the United States Patent and Trademark Office*